United States Patent
Lai et al.

(10) Patent No.: US 7,208,415 B2
(45) Date of Patent: Apr. 24, 2007

(54) PLASMA TREATMENT METHOD FOR ELECTROMIGRATION REDUCTION

(75) Inventors: Jane-Bai Lai, Hsin-Chu (TW); Yi-Lung Cheng, Danshuei Township, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 147 days.

(21) Appl. No.: 10/882,069

(22) Filed: Jun. 30, 2004

(65) Prior Publication Data

US 2006/0003486 A1 Jan. 5, 2006

(51) Int. Cl.
*H01L 21/44* (2006.01)

(52) U.S. Cl. .............. 438/687; 438/637; 257/621; 257/E21.575

(58) Field of Classification Search .......... 438/626, 438/629, 631, 637, 645, 668, 672, 675, 680, 438/792, 798, 687, 691; 257/621
See application file for complete search history.

(56) References Cited

U.S. PATENT DOCUMENTS

| | | | | |
|---|---|---|---|---|
| 6,506,677 | B1 * | 1/2003 | Avanzino et al. | 438/687 |
| 6,713,386 | B1 * | 3/2004 | Hu et al. | 438/639 |
| 2002/0177329 | A1 * | 11/2002 | Yang et al. | 438/798 |

* cited by examiner

*Primary Examiner*—Quoc Hoang
(74) *Attorney, Agent, or Firm*—Tung & Associates

(57) ABSTRACT

A plasma treatment method which is capable of extending the MTF (mean-time-to-failure) of metal interconnects fabricated on a semiconductor wafer substrate, is disclosed. The invention includes providing a trench typically in a dielectric layer on a substrate; depositing a metal in the trench; and exposing the metal to a nitrogen-based plasma. The plasma-treatment step accelerates grain growth and re-orients the grains in the metal to a closely-packed crystal orientation texture which approaches or approximates the <111> crystal orientation texture of copper.

18 Claims, 3 Drawing Sheets

PLASMA TREATMENT METHOD FOR ELECTROMIGRATION REDUCTION

FIELD OF THE INVENTION

The present invention relates to metal interconnect layers which connect integrated circuit devices in semiconductor fabrication. More particularly, the present invention relates to a plasma treatment method for the post-treatment of a metal interconnect layer electroplated on a substrate to re-orient grains in the layer and improve electromigration characteristics of the layer.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner. The various layers define circuit components or devices such as transistors.

After the individual devices have been fabricated on the substrate, they must be connected together to perform the desired circuit functions. This interconnection process is generally known as "metallization" and is performed using a number of different photolithographic, deposition, and removal techniques. In one interconnection process, called a "dual damascene" technique, two interconnect channels of conductor materials are separated by interlayer dielectric layers in vertically separated planes perpendicular to each other and interconnected by a vertical connection, or "via", at their closest point.

In the dual damascene process, the vias and the trenches are etched in the same step, and the etch stop layer defines the bottom of the trenches. In other variations, the trench is patterned and etched after the via. In the single damascene process, the vias and trenches are individually, rather than simultaneously, filled with copper inlays.

In the semiconductor industry, aluminum has been frequently used in the past as a metal film for forming lines or wiring, due to the electrical advantages of aluminum including conductivity, ohmic contact property to silicon, wire bonding property, and processibility. Multilevel metal oxide semiconductor (MOS) device technology continues to evolve with the development of faster and more reliable MOS devices. Currently, there is a drive to replace aluminum metallization, tungsten interconnection and titanium and titanium nitride barrier layer fabrication with copper. In multilevel metallization using copper, the crystallographic structure of the metal layers and the nucleation of grain size and structure will have an increasing effect on the quality and yield of device products.

A cross-section of a conventional metallization structure 10 for connecting devices on a semiconductor substrate 12 is shown in FIG. 1. The structure 10 includes a conductive line 18, such as copper, deposited on the substrate 12. A dielectric layer 14 overlies the substrate 12 and the conductive line 18. A via 16, filled with a conductive material 20 such as copper, extends through the dielectric layer 14 and contacts the conductive line 18. A metal line 22 is deposited on the dielectric layer 14 and lies in contact with the conductive material 20. The metal line 22 provides electrical contact between the conductive line 18 and an integrated circuit device (not shown) fabricated on the substrate 12.

During current flow through the conductive line 18, conductive material 20 and metal line 22, electrons flow through these elements in the direction of the predominant current flow. Over time, the flowing electrons cause material transport of the metal in the elements. This electromigration of the metal atoms, in combination with repeated thermal cycles applied to the elements, may eventually cause the metal line 22 to pull away from the conductive material 20, breaking contact between the metal line 22 and the conductive line 18, as shown in FIG. 2.

The medium-time-to-failure (MTF), which is the medium time which elapses between initial onset of current flow and electromigration-induced failure, is believed to be related to the grain size in the metal film; the distribution of grains in the film; the degree to which the metal in the conductive material or metal line approximates the <111> crystal orientation texture; and the method of film deposition and line width. Copper interconnect lines having a relatively high ratio of lower-angle grain boundaries have been shown to have a high MTF. In other words, copper interconnect lines which have a highly-aligned grain or crystal orientation have exhibited a high MTF. The copper <111> crystal orientation texture is characterized by a highly-aligned crystal orientation. Therefore, copper materials having the <111> crystal orientation texture have a relatively high MTF.

In the conventional process for fabricating a conventional metallization structure 10 on a substrate 12, the conductive material 20 is deposited in the via 16 and the metal line 22 is deposited on the dielectric layer 14, typically using electroplating techniques. The conductive material 20 and metal line 22 are then subjected to CMP and annealed typically using heated nitrogen gas in a thermal processing furnace. However, during the annealing process, the copper crystal orientation texture is altered from the highly-aligned and packed <111> crystal orientation texture to a more randomly-oriented orientation texture. This substantially decreases the MTF of the metal line 22. Accordingly, a novel treatment method is needed for re-orienting the crystal orientation texture of a conductive metal to a <111> orientation texture in order to increase the MTF of the metal.

An object of the present invention is to provide a novel plasma treatment method for the reduction of electromigration in a metal.

Another object of the present invention is to provide a novel plasma treatment method which is capable of prolonging the lifetime of metal interconnects fabricated on a semiconductor substrate.

Still another object of the present invention is to provide a novel plasma treatment method which is capable of increasing the MTF (mean-time-to-failure) of metal interconnect layers in a semiconductor device.

Yet another object of the present invention is to provide a novel plasma treatment method which includes the plasma treatment of a metal electroplated into a trench opening in order to provide a crystal orientation texture which at least approximates the <111> crystal orientation texture of the metal.

SUMMARY OF THE INVENTION

In accordance with these and other objects and advantages, the present invention is generally directed to a novel plasma treatment method which is capable of extending the MTF (mean-time-to-failure) of metal interconnects fabricated on a semiconductor wafer substrate. The invention includes providing a trench typically in a dielectric layer on a substrate; depositing a metal in the trench; and exposing the metal to a nitrogen-based plasma. The plasma-treatment step accelerates grain growth and re-orients the grains in the metal to a closely-packed crystal orientation texture which approaches or approximates the <111> crystal orientation texture of copper.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel plasma treatment method which renders a metal interconnect conductive layer resistant to electromigration caused by prolonged current flow and thermal cycles in IC devices. Consequently, the MTF (mean-time-to-failure) of the conductive layer is prolonged. The invention includes subjecting the metal layer to a nitrogen-based plasma after the metal layer is deposited typically on a dielectric layer in the fabrication of metal interconnects for integrated circuit (IC) devices. The plasma-treatment step accelerates the growth of grains in the metal and re-orients the grains to a crystal orientation texture which approaches or approximates the <111> crystal orientation texture of copper, which is known to exhibit high electromigration resistance properties.

Figure 1A:
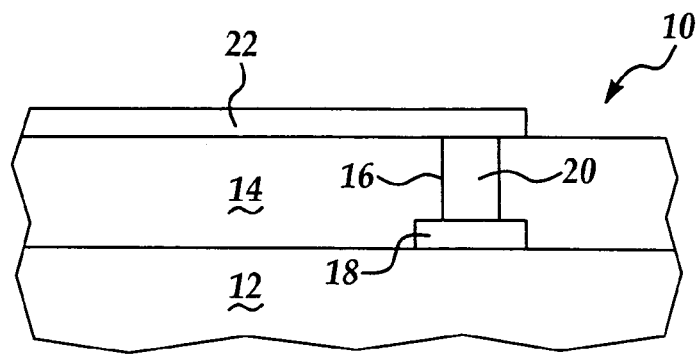
FIG. 1A is a cross-section of a conventional metallization structure for connecting IC devices on a semiconductor wafer substrate.
Figure 1B:
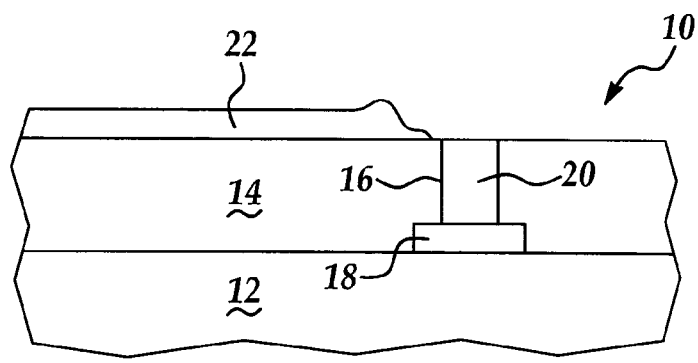
FIG. 1B is a cross-sectional view of a conventional metallization structure, illustrating electromigration of metal in a metal line caused by prolonged current flow and repeated thermal cycles.
Figure 2A:
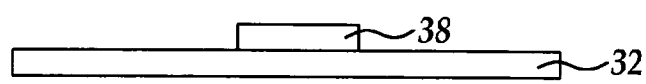
FIGS. 2A–2H are cross-sectional views, respectively, of a metallization structure being sequentially fabricated on a substrate according to the method of the present invention.
Figure 2B:
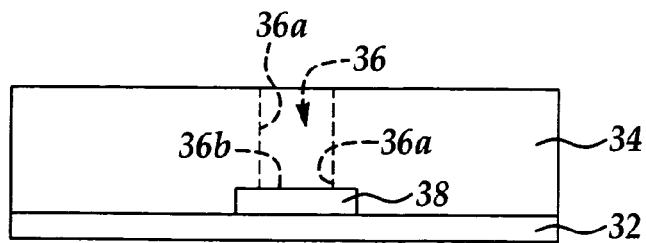
Figure 2C:
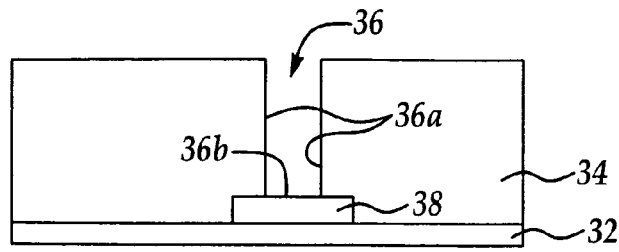
Figure 2D:
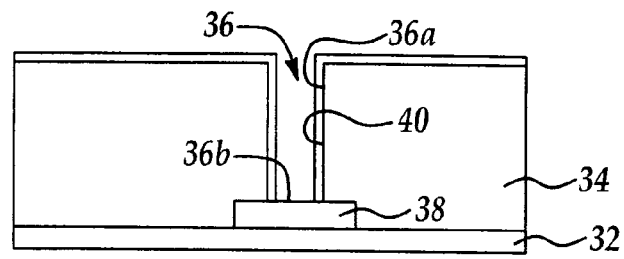
Figure 2E:
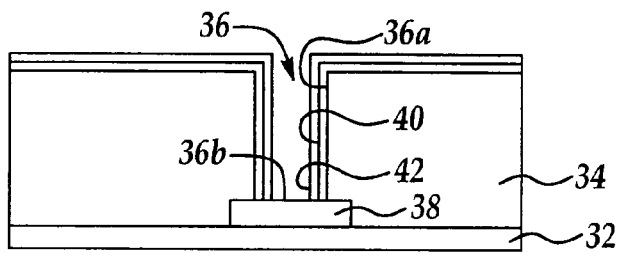
Figure 2F:
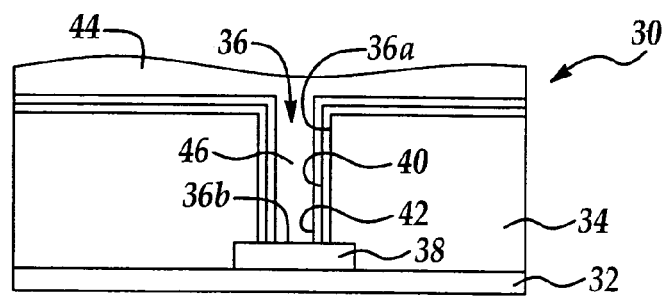
Figure 2G:
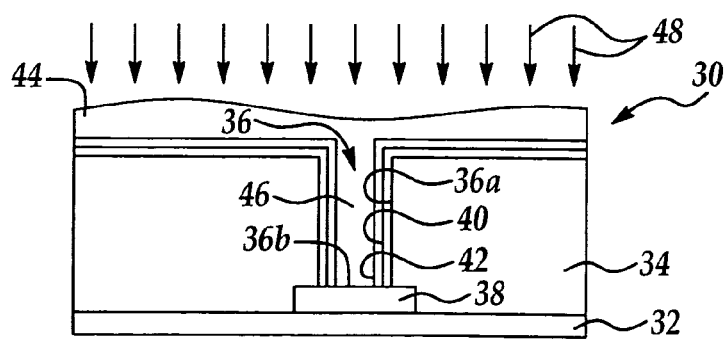
Figure 2H:
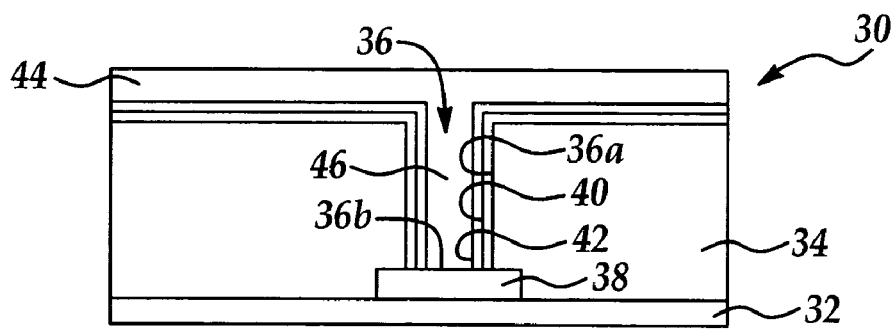

Referring to FIG. 2H, a metal interconnect structure 30, having a metal layer 44 previously subjected to the plasma treatment method of the present invention, is generally indicated in cross-section by reference numeral 30. The interconnect structure 30 typically includes a silicon semiconductor wafer substrate 32 on which is deposited a conductive line 38, such as copper. The conductive line 38 provides horizontal electrical connection between IC devices (not shown) fabricated on the substrate 32.

A dielectric layer 34, such as silicon dioxide, for example, covers the substrate 32 and a portion of the conductive line 38. A via opening 36 extends downwardly through the dielectric layer 34. A metal barrier layer 40 lines the via opening 36. A seed layer 42 covers the barrier layer 40. A metal conductive layer 44 covers the upper surface of the seed layer 42, and a conductive via 46 typically extends downwardly from the metal conductive layer 44 and fills the via opening 36. The conductive via 46 provides vertical electrical connection between IC devices (not shown) fabricated on the substrate 32. The conductive line 38 and metal conductive layer 44 provide horizontal electrical connection between IC devices.

The metal interconnect structure 30 may be fabricated according to a single-damascene, dual-damascene or any other suitable fabrication method known by those skilled in the art. Accordingly, the fabrication process which will be hereinafter described with respect to FIGS. 2A–2H is merely illustrative. Thus, it is understood that the fabrication method for the interconnect structure 30 may omit some of the steps described herein and/or include steps in addition to those described herein, depending on the particular type of interconnect structure 30 which is needed for the desired application. For example, the interconnect structure 30 may include a trench opening (not shown) provided in a trench dielectric layer (not shown) deposited above the dielectric layer 34. In that case, the trench opening (not shown) may be formed in the trench dielectric layer and a metal line (not shown) formed in the trench opening, above and in electrically conductive relationship to the conductive via 46.

Referring next to FIG. 2A, the interconnect structure 30 is fabricated by initially forming the metal conductive line 38 on the substrate 32. Alternatively, the metal conductive line 38 may be formed on or in a dielectric layer (not shown) which was previously deposited on the substrate 32 or on a previously-deposited conductive layer. The conductive line 38 is formed typically by initially depositing a conductive layer (not shown) on the substrate 32 using chemical vapor deposition (CVD), physical vapor deposition (PVD) or electrochemical plating (ECP), for example. The conductive layer is then patterned using photolithography techniques and etched to form the conductive line 38 having the desired linewidth and pattern, as is known by those skilled in the art.

Referring next to FIG. 2B, the dielectric layer 34 is then formed over the substrate 32 and the conductive line 38, typically using plasma-enhanced chemical vapor deposition (PECVD) techniques, for example. The dielectric layer 34 has a thickness which corresponds to the depth of the via opening 36 to be subsequently etched in the dielectric layer 34. Next, a thin etch stop layer (not shown), typically silicon nitride, is deposited on the dielectric layer 34.

A typical flow of process steps according to the method of the present invention is shown in the flow diagram of FIG.

3. In step 51, a via opening is etched in a dielectric layer deposited on a substrate. In step 52, the via opening is lined with a barrier layer. In step 53, a seed layer is deposited on the barrier layer. In step 54, a metal such as copper is electroplated into the via opening to form a conductive via and onto the dielectric layer to form a metal layer on the dielectric. In step 55, the metal layer deposited on the dielectric layer is exposed to a nitrogen-based plasma. In step 56, the treated metal layer is subjected to chemical mechanical planarization (CMP).

An ionized cleaning gas (not shown), such as argon or a reactive plasma, may then be used to clean and remove particles from the via sidewalls 36a and via bottom 36b. However, it is understood that the ionized gas cleaning process is optional and may be omitted for purposes of the present invention.

Referring next to FIG. 2D, the metal barrier layer 40 is next deposited on the via sidewalls 36a and the via bottom 36b, typically using a high kinetic energy plasma deposition process, for example. The thickness of the barrier layer 40 must be substantially uniform for optimum deposition of a seed layer on the barrier layer 52 in a subsequent processing step. Preferably, the barrier layer 40 has a thickness of typically from about 200 Å to about 400 Å. The barrier layer 40 is preferably tantalum (Ta), since tantalum is an ideal candidate for copper interconnect metallurgy. Other suitable metals for the barrier layer 40 include tantalum nitride (TaN), tantalum silicon nitride (TaSiN), titanium (Ti) and titanium nitride (TiN), for example.

Referring next to FIG. 2E, the seed layer 42, which is typically copper, is deposited on the barrier layer 40, typically using conventional CVD techniques. As shown in FIG. 2F, in a subsequent electrochemical plating step, copper is deposited on the seed layer 42 to form the copper conductive via 46 in the via opening 36. In the same or a subsequent step, the metal layer 44, typically copper, is deposited on the upper surface of the seed layer 42.

Referring next to FIG. 2G, according to the method of the present invention, the metal layer 44 is next exposed to a nitrogen-based plasma 48. The nitrogen-based plasma 48 may be formed using molecular nitrogen ($N_2$) or ammonia ($NH_3$), for example, using an inert carrier gas such as argon (Ar), for example. The plasma-exposure step is carried out by placing the substrate 32 in an RF (radio frequency) plasma CVD chamber (not shown); forming a gas mixture which includes a carrier gas and nitrogen or ammonia; introducing the gas mixture into the CVD chamber; forming a nitrogen-based plasma 48 from the gas mixture; and exposing the metal layer 44 to the plasma 48. The nitrogen-based plasma 48 accelerates the growth of metal granules (not shown) in the metal layer 44 to facilitate a tightly-packed crystal orientation texture which closely approximates that of the <111> crystal orientation texture of the metal.

The plasma-exposure step shown in FIG. 2G may be carried out under the following process conditions: a chamber temperature of typically about 200~800 degrees C., and preferably, about 300 degrees C.; a chamber pressure of typically about 2~5 Torr, and preferably, about 3.5 Torr; a gas flow rate of typically about 100~500 sccm, and preferably, about 300 sccm; and a radio frequency (RF) power of typically about 100~300 watts, and preferably, about 200 watts.

Referring next to FIG. 2H, after the plasma-exposure step, the metal layer 44 is typically subjected to chemical mechanical planarization (CMP) to planarize or smooth the upper surface of the metal layer 44 and complete fabrication of the damascene interconnect structure 30, as is known by those skilled in the art.

Figure 3:
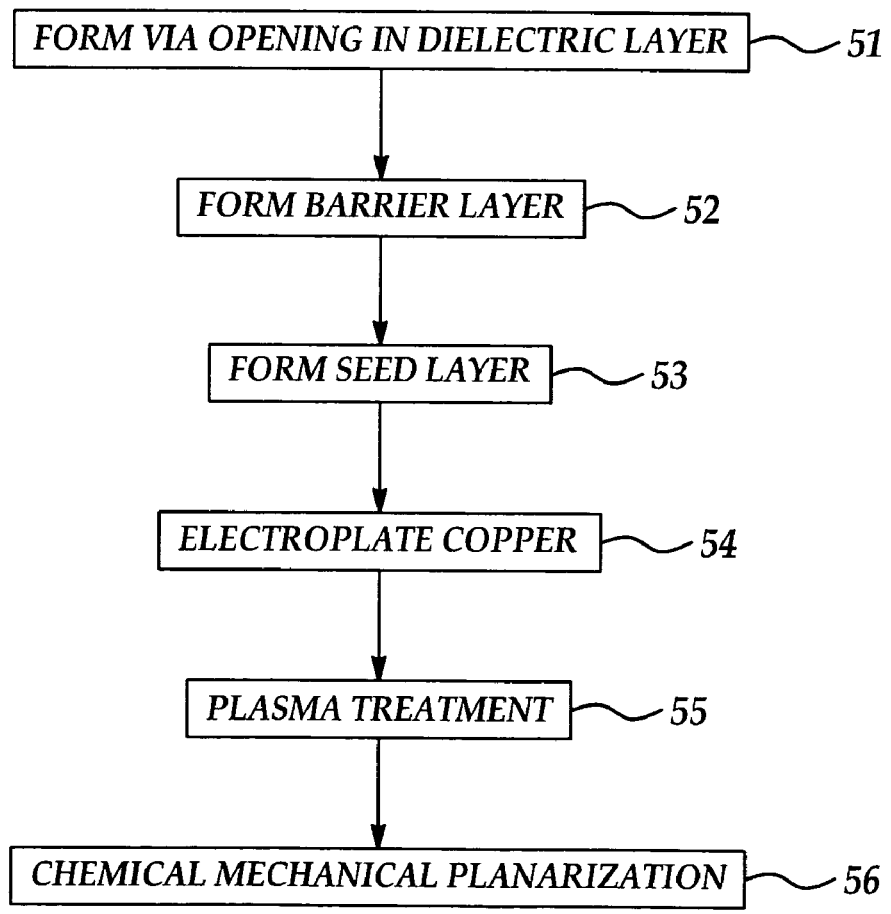
FIG. 3 is a flow diagram illustrating a typical flow of process steps carried out according to the method of the present invention.

A typical flow of process steps according to the method of the present invention is shown in the flow diagram of FIG. 3. In step S1, a via opening is etched in a dielectric layer deposited on a substrate. In step S2, the via opening is lined with a barrier layer. In step S3, a seed layer is deposited on the barrier layer. In step S4, a metal such as copper is electroplated into the via opening to form a conductive via and onto the dielectric layer to form a metal layer on the dielectric. In step S5, the metal layer deposited on the dielectric layer is exposed to a nitrogen-based plasma. In step S6, the treated metal layer is subjected to chemical mechanical planarization (CMP).

While the preferred embodiments of the invention have been described above, it will be recognized and understood that various modifications can be made in the invention and the appended claims are intended to cover all such modifications which may fall within the spirit and scope of the invention.

What is claimed is:

1. A method of reducing electromigration in a metal damascene by a plasma treatment to promote said metal grain growth and <111> crystallographic orientation, comprising:
   providing a damascene opening in a dielectric layer;
   filling the damascene opening with metal including forming a metal layer overlying the dielectric layer upper surface;
   providing a nitrogen-containing gas;
   generating a plasma from said gas;
   treating the metal layer overlying the dielectric layer upper surface with said plasma without deposition of a material layer on said metal layer, said step of treating performed to promote said metal grain growth and <111> crystallographic orientation; and chemical mechanical polishing (CMP) said metal layer following said step of treating.

2. The method of claim 1 wherein said nitrogen-containing gas is selected from the group consisting of $NH_3$, $N_2$, and combinations thereof.

3. The method of claim 1 wherein said nitrogen-containing gas further comprises argon.

4. The method of claim 3 wherein said nitrogen-containing gas comprises ammonia.

5. The method of claim 1 wherein said nitrogen-containing gas comprises molecular nitrogen.

6. The method of claim 1 further comprising the step of chemical mechanical polishing said metal after said step of treating.

7. The method of claim 1 wherein said nitrogen-containing gas is selected from the group consisting of $NH_3$, $N_2$, and combinations thereof.

8. The method of claim 1, wherein said metal comprises copper formed by electrochemical deposition.

9. A method of reducing electromigration in a metal damascene by a plasma treatment to promote said metal grain growth and <111> crystallographic orientation, comprising:
   providing a substrate;
   providing a dielectric layer on said substrate;
   forming a conductive via in said dielectric layer and a metal layer on said dielectric layer including overlying an upper surface of said dielectric layer;
   treating said metal layer on said dielectric layer upper surface with a nitrogen-containing plasma without subsequent deposition of a material layer on said metal layer on said dielectric layer upper surface, said step of treating performed to promote said metal grain growth and <111> crystallographic orientation; and chemical mechanical polishing (CMP) said metal layer following said step of treating.

10. The method of claim 9 wherein said nitrogen-containing gas further comprises argon.

11. The method of claim 10 wherein said nitrogen-containing gas comprises ammonia.

12. The method of claim 9 wherein said nitrogen-containing gas comprises molecular nitrogen.

13. The method of claim 12 wherein said nitrogen-containing gas further comprises argon.

14. A method of reducing electromigration in a copper damascene by a plasma treatment to promote said copper grain growth and orientation, comprising:

providing a damascene opening in a dielectric layer;

filling the damascene opening with copper including a copper layer overlying the dielectric layer upper surface;

providing a nitrogen-containing gas;

generating a plasma from said gas;

plasma treating said copper layer overlying said dielectric layer upper surface with said plasma without depositing a material layer on said copper layer, said step of plasma treating performed to promote said copper grain growth and <111> crystallographic orientation of said copper grains; and, carrying out a CMP process following said step of plasma treating to planarize said copper layer.

15. The method of claim 14 wherein said nitrogen-containing gas comprises ammonia.

16. The method of claim 14 wherein said nitrogen-containing gas comprises argon.

17. The method of claim 14 wherein said nitrogen-containing gas comprises molecular nitrogen.

18. The method of claim 14 wherein said generating a plasma from said gas in said plasma CVD chamber comprises generating said plasma from said gas under the following conditions: a plasma temperature of from about 200 to about 800 degrees C.; a chamber pressure of from about 2 to about 5 Torr; a flow rate of said nitrogen-containing gas of from about 100 to about 500 sccm; and a radio frequency power of from about 100 to about 300 watts.

* * * * *